(12) United States Patent
Prejean et al.

(10) Patent No.: US 9,627,281 B2
(45) Date of Patent: Apr. 18, 2017

(54) SEMICONDUCTOR CHIP WITH THERMAL INTERFACE TAPE

(75) Inventors: Seth Prejean, Austin, TX (US); Dales Kent, Round Rock, TX (US); Ronnie Brandon, Austin, TX (US); Gamal Refai-Ahmed, Markam (CA); Michael Z. Su, Round Rock, TX (US); Michael Bienek, Austin, TX (US); Joseph Siegel, Brookline, MA (US); Bryan Black, Spicewood, TX (US)

(73) Assignees: Advanced Micro Device, Inc., Sunnyvale, CA (US); ATI Technologies ULC, Markham (CA)

( * ) Notice: Subject to any disclaimer, the term of this patent is extended or adjusted under 35 U.S.C. 154(b) by 875 days.

(21) Appl. No.: 12/860,256

(22) Filed: Aug. 20, 2010

(65) Prior Publication Data

US 2012/0043539 A1 Feb. 23, 2012

(51) Int. Cl.
*H01L 23/58* (2006.01)
*H01L 21/66* (2006.01)
(Continued)

(52) U.S. Cl.
CPC ............ *H01L 22/20* (2013.01); *H01L 21/563* (2013.01); *H01L 21/6835* (2013.01); *H01L 21/6836* (2013.01); *H01L 25/0657* (2013.01); *H01L 22/14* (2013.01); *H01L 23/42* (2013.01); *H01L 2221/68327* (2013.01); *H01L 2221/68386* (2013.01); *H01L 2224/16225* (2013.01); *H01L 2224/32225* (2013.01); *H01L 2224/73204* (2013.01); *H01L 2224/73253* (2013.01); *H01L 2224/81002* (2013.01); *H01L 2224/81815* (2013.01); *H01L 2224/831* (2013.01); *H01L 2225/06513* (2013.01); *H01L 2225/06517* (2013.01); *H01L 2225/06565* (2013.01);
(Continued)

(58) Field of Classification Search
CPC . H01L 2224/97; H01L 23/34; H01L 2224/94; H01L 23/36; H01L 23/49816; H01L 2225/06513; H01L 2225/06517; H01L 2225/06589; H01L 23/42; H01L 24/97; H01L 2224/83191; H01L 33/62; H01L 21/4882
USPC ............................ 438/15, 114, 118; 257/777
See application file for complete search history.

(56) References Cited

U.S. PATENT DOCUMENTS 5,411,921 A * 5/1995 Negoro .......................... 438/118
5,641,714 A * 6/1997 Yamanaka ....................... 438/14
(Continued)

OTHER PUBLICATIONS

Richard Webb; *Temporary Bonding Enables New Processes Requiring Ultra-Thin Wafers*; Solid State Techology; www.solid-state.com; Feb. 2010; pp. 1-3.
(Continued)

*Primary Examiner* — Marc Armand
*Assistant Examiner* — Sarah Salerno
(74) *Attorney, Agent, or Firm* — Timothy M. Honeycutt

(57) ABSTRACT

A method of manufacturing is provided that includes applying a thermal interface tape to a side of a semiconductor wafer that includes at least one semiconductor chip. The thermal interface material tape is positioned on the at least one semiconductor chip. The at least one semiconductor chip is singulated from the semiconductor wafer with at least a portion of the thermal interface tape still attached to the semiconductor chip.

16 Claims, 5 Drawing Sheets

(51) Int. Cl.
  *H01L 21/56*  (2006.01)
  *H01L 21/683* (2006.01)
  *H01L 25/065* (2006.01)
  *H01L 23/42*  (2006.01)

(52) U.S. Cl.
  CPC .................. *H01L 2924/014* (2013.01); *H01L 2924/01019* (2013.01); *H01L 2924/01079* (2013.01)

(56) References Cited

U.S. PATENT DOCUMENTS

| | | | |
|---|---|---|---|
| 6,841,414 B1* | 1/2005 | Hu et al. | 438/106 |
| 2002/0004288 A1* | 1/2002 | Nishiyama | 438/464 |
| 2004/0113283 A1* | 6/2004 | Farnworth et al. | 257/782 |
| 2005/0072334 A1* | 4/2005 | Czubarow et al. | 106/270 |
| 2006/0186909 A1* | 8/2006 | Aube et al. | 324/760 |
| 2006/0197210 A1* | 9/2006 | Kim | 257/686 |
| 2008/0001268 A1* | 1/2008 | Lu | 257/678 |
| 2010/0003771 A1* | 1/2010 | Nagai et al. | 438/15 |
| 2010/0029045 A1* | 2/2010 | Ramanathan et al. | 438/114 |

OTHER PUBLICATIONS

Saint-Gobain Performance Plastics Corporation; *TF1869 Thermally Conductive Silicone Coated Fabric*; 2007; p. 1.
Saint-Gobain Performance Plastics Corporation; *TF1818 Thermally Conductive Silicone Coated Fabric*; 2005; p. 1.
Saint-Gobain Performance Plastics Corporation; *K271 Thermally Conductive Silicone Coated KAPTON® Tape*; 2005; p. 1.
Electronics Markets Materials Division 3M Electronics; *3M™ Thermal Management Solutions for Electronics*; Sep. 2008; pp. 1-6.

\* cited by examiner

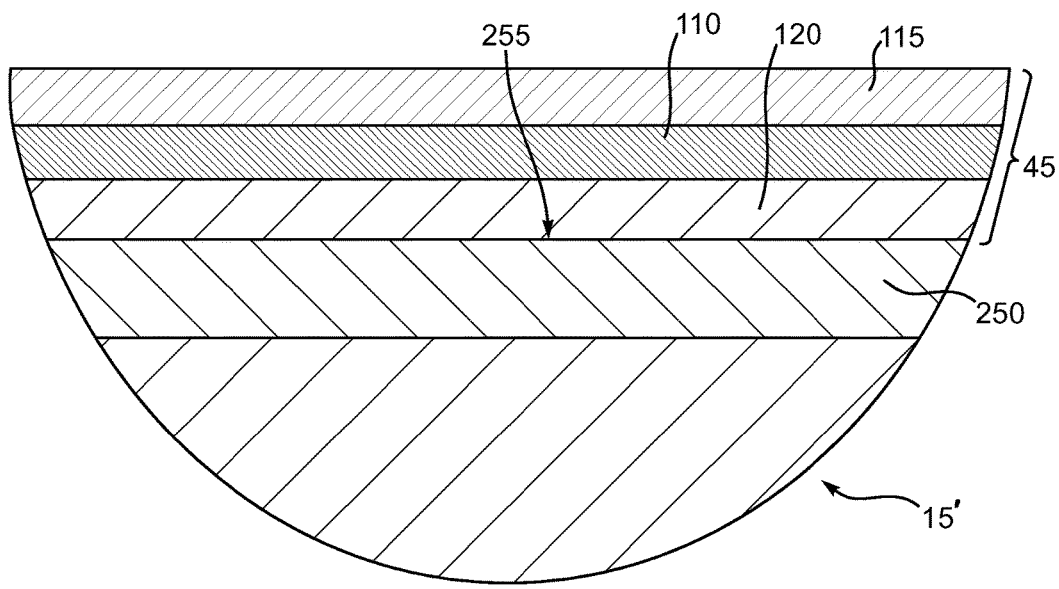
FIG. 10
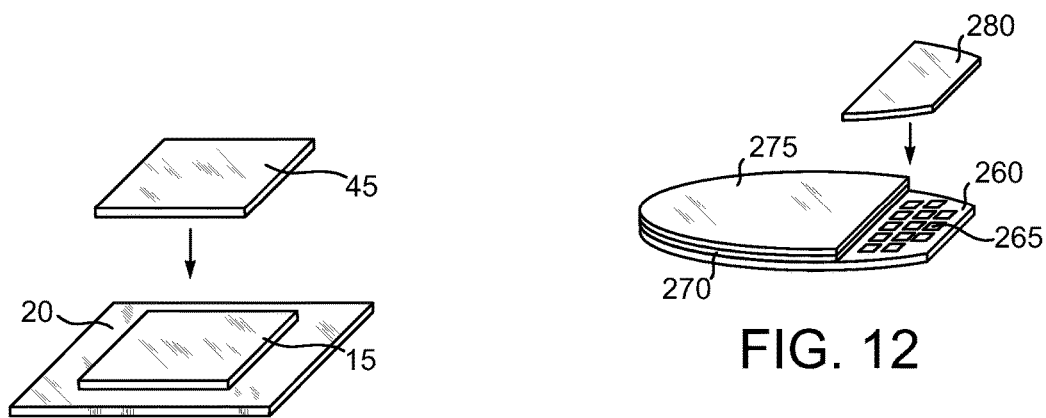
FIG. 11
FIG. 12

SEMICONDUCTOR CHIP WITH THERMAL INTERFACE TAPE

BACKGROUND OF THE INVENTION

1. Field of the Invention

This invention relates generally to semiconductor processing, and more particularly to thermal interface materials for semiconductor chips and to methods of using the same.

2. Description of the Related Art

Stacked semiconductor chip devices present a host of design and integration challenges for scientists and engineers. Common problems include providing adequate electrical interfaces between the stacked semiconductor chips themselves and between the individual chips and some type of circuit board, such as a motherboard or semiconductor chip package substrate, to which the semiconductor chips are mounted. Another critical design issue associated with stacked semiconductor chips is thermal management. Most electrical devices dissipate heat as a result of resistive losses, and semiconductor chips and the circuit boards that carry them are no exception. Still another technical challenge associated with stacked semiconductor chips is testing.

A process flow to transform a bare semiconductor wafer into a collection of chips and then mount those chips on packages or other boards involves a large number of individual steps. Because the processing and mounting of a semiconductor chip proceeds in a generally linear fashion, that is, various steps are usually performed in a specific order, it is desirable to be able to identify defective parts as early in a flow as possible. In this way, defective parts may be identified so that they do not undergo needless additional processing. This economic incentive to identify defective parts as early in the processing phase as possible is certainly present in the design and manufacture of stacked semiconductor chip devices. This follows from the fact that a typical process flow for fabricating a stacked semiconductor chip device includes the multitude of fabrication steps that go into successively mounting a plurality of singulated semiconductor chips to a circuit board. If, for example, the first semiconductor chip mounted to a carrier substrate is revealed to be defective only after several other semiconductor chips are stacked thereon, then all of the material processing steps and the materials associated with the later-mounted chips may have been wasted.

Thermal management of a semiconductor chip or chips in a stacked arrangement remains a technical challenge during required electrical testing of one or more of the semiconductor chips. A given semiconductor chip in a stacked arrangement, whether the first, an intermediary or the last in the particular stack, may dissipate heat to such an extent that active thermal management is necessary in order to either prevent the one or all of the semiconductor chips in the stack from entering thermal runaway or so that one or more of the semiconductor chips in the stack may be electrically tested at near or true operational power levels and frequencies.

The present invention is directed to overcoming or reducing the effects of one or more of the foregoing disadvantages.

SUMMARY OF EMBODIMENTS OF THE INVENTION

In accordance with one aspect of an embodiment of the present invention, a method of manufacturing is provided that includes applying a thermal interface tape to a side of a semiconductor wafer that includes at least one semiconductor chip. The thermal interface material tape is positioned on the at least one semiconductor chip. The at least one semiconductor chip is singulated from the semiconductor wafer with at least a portion of the thermal interface tape still attached to the semiconductor chip.

In accordance with another aspect of an embodiment of the present invention, a method of testing a semiconductor chip device is provided that includes applying a first thermal interface tape to a side of a first semiconductor chip of the semiconductor chip device and placing a heat spreader in thermal contact with the first thermal interface tape. An electrical test is performed on the first semiconductor chip.

In accordance with another aspect of an embodiment of the present invention, an apparatus is provided that includes a first semiconductor chip that has a first side adapted to couple to a circuit board and a second side adapted to couple to a second semiconductor chip. A thermal interface tape is positioned on the second side of the first semiconductor chip.

In accordance with another aspect of an embodiment of the present invention, an apparatus is provided that includes a first semiconductor chip that has a first side adapted to couple to a circuit board and a second side. A second semiconductor chip is coupled to the second side and includes a third side. A thermal interface tape is positioned on the third side.

BRIEF DESCRIPTION OF THE DRAWINGS

The foregoing and other advantages of the invention will become apparent upon reading the following detailed description and upon reference to the drawings in which:

FIG. 10 is a sectional view like FIG. 2, but of an alternate exemplary embodiment of a semiconductor chip;

FIG. 11 is a partially exploded pictorial view of the exemplary embodiment of the semiconductor chip device; and FIG. 12 is a pictorial view of an alternate exemplary embodiment of a semiconductor wafer with partial application of a thermal interface tape.

DETAILED DESCRIPTION OF SPECIFIC EMBODIMENTS

Application of a thermal interface tape on a semiconductor chip slated for a stacked semiconductor chip device is used to provide a transient thermal pathway from the semiconductor chip to a heat spreader. With the thermal interface tape in place, the semiconductor chip can undergo electrical testing at high powers and frequencies with suitable thermal management. If the semiconductor chip passes testing, the thermal interface tape can be removed and another semiconductor can be stacked on first semiconductor chip and the process repeated. Additional details will now be disclosed.

Figure 1:
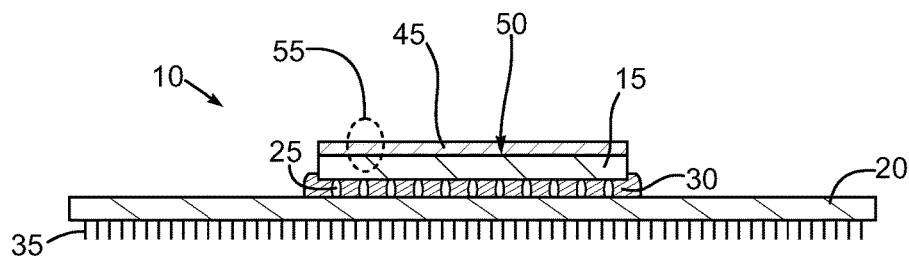
FIG. 1 is a sectional view of an exemplary embodiment of a semiconductor chip device that includes at least one semiconductor chip that may be mounted to a circuit board.

In the drawings described below, reference numerals are generally repeated where identical elements appear in more than one figure. Turning now to the drawings, and in particular to FIG. 1 is a sectional view of an exemplary embodiment of a semiconductor chip device 10 that includes at least one semiconductor chip 15 that may be mounted to a circuit board 20 and electrically interfaced therewith by plural interconnect structures 25. The semiconductor chip device 10 is designed to include at least one other semiconductor chip stacked on the semiconductor chip 15. However, the semiconductor chip device 10 is depicted at an intermediate stage of processing prior to mounting of the additional semiconductor chip(s). The interface structures 25 may be conductor bumps of various types of lead-free or lead-based solders, conductor pillars composed of the same types of solders, copper, silver, platinum, gold, aluminum, palladium, alloys of these or the like. To lessen the effects of differential CTE between the semiconductor chip 15, the carrier substrate 20 and the interconnect structures 25, an underfill material layer 30 may be applied between the semiconductor chip 15 and the circuit board 20.

The circuit board 20 may be a semiconductor chip package substrate, a circuit card, or virtually any other type of printed circuit board. Although a monolithic structure could be used for the circuit board 20, a more typical configuration will utilize a buildup design. In this regard, the circuit board 20 may consist of a central core upon which one or more buildup layers are formed and below which an additional one or more buildup layers are formed. The core itself may consist of a stack of one or more layers. If implemented as a semiconductor chip package substrate, the number of layers in the circuit board 20 can vary from four to sixteen or more, although less than four may be used. So-called "coreless" designs may be used as well. The layers of the circuit board 20 may consist of an insulating material, such as various well-known epoxies, interspersed with metal interconnects. A multi-layer configuration other than buildup could be used. Optionally, the circuit board 20 may be composed of well-known ceramics or other materials suitable for package substrates or other printed circuit boards. The circuit board 20 is provided with a number of conductor traces and vias and other structures (not visible) in order to provide power, ground and signals transfers between the semiconductor chip device 10 and another device, such as another circuit board for example. The circuit board 20 may be electrically connected to another device (not shown) by way of an input/output array. In this illustrative embodiment, the input/output structures may consist of a pin grid array 35. However, the skilled artisan will appreciate that other types of interconnects, such as ball grid arrays, land grid arrays or other interconnect structures may be used as well.

A variety of economic efficiencies may be obtained if the semiconductor chip 15 can be subjected to various electrical and thermal tests to verify its quality and performance prior to the stacking thereon of additional semiconductor chips. If the semiconductor chip 15 is defective and can be identified as such prior to the stacking of additional chips therewith, then the costs associated both with the processes for stacking additional chips and the potential loss of those additional chips due to scrap or the otherwise inability to rework those stacked chips will be avoided. To enable the semiconductor chip 15 to be subjected to electrical testing at power and frequency settings that will be representative of the actual operation of the semiconductor chip device 10, it is desirable to provide a thermal interface for the semiconductor chip so that a heat sink of one type or another may be placed thereon and used to transfer heat to a surrounding environment. To provide an advantageous thermal pathway, a thermal interface tape 45 may be applied to an upper surface 50 of the semiconductor chip 15. The portion of FIG. 1 circumscribed by the dashed oval 55 will be shown at greater magnification in FIG. 2 and used to describe additional details of the thermal interface tape 45.

Figure 2:
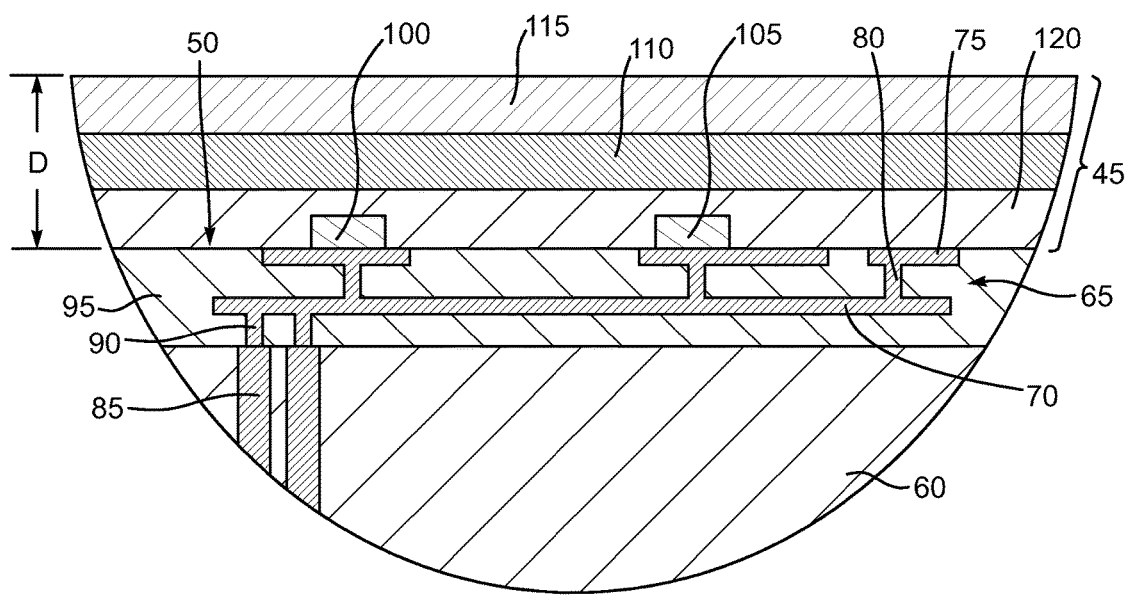
FIG. 2 is a portion of FIG. 1 depicted at greater magnification.

Attention is now turned to FIG. 2. Because of the location of the dashed oval 55 in FIG. 1, FIG. 2 depicts a portion of the thermal interface tape 45 and the semiconductor chip 15. The semiconductor chip 15 may consist of a bulk semiconductor portion 60 upon which a backside redistribution layer structure 65 is formed. The RDL structure 65 may consist of multiple layers 70 and 75 interconnected by vias 80. Electrical pathways from the RDL layers 70 and 75 may be transmitted through the bulk semiconductor portion 60 to, for example, the interconnect structures 25 shown in FIG. 1 or various active circuit elements (not shown) within the semiconductor chip 15, by way of, for example, thru-silicon vias 85. The thru-silicon vias 85 may be connected to the RDL structure 65 by way of vias 90. The RDL structure 65 may be surrounded laterally and in some cases vertically by way of an insulating layer 95, which may be a laminate of several insulating material layers formed in successive deposition, etching and metal deposition processes in a build up fashion.

The semiconductor chip 15 is designed to electrically interface with another semiconductor chip stacked above the side 50. To enable this electrical interface, the semiconductor chip 15 may be provided with plural input/output (I/O) pads, two of which are visible and labeled 100 and 105. The I/O pads 100 and 105 may be connected to various portions of, for example, the RDL layer 75. Depending on the complexity and size of the semiconductor chip 15, there may be more than two RDL layers 70 and 75 and hundreds or more of the I/O pads 100 and 105. The thermal interface tape 45 serves two important functions. First, the thermal interface tape 45 provides a thermal interface material to facilitate heat transfer from the semiconductor chip 15 to a heat spreader or sink (not shown) during electrical testing prior to the stacking of an additional semiconductor chip (not shown). In addition, the thermal interface tape 45 provides a protective coating for the I/O pads 100 and 105 during handling and the electrical testing of the semiconductor chip prior to stacking with another chip.

The thermal interface tape 45 may take on a variety of configurations. In this illustrative embodiment, the thermal interface tape 45 may consist of a base layer 110 that provides a compliant yet strong backing for a thermal interface material layer 115 that is secured to one side thereof and an adhesive 120 secured to the opposite side. The adhesive 120 facilitates adhesion of the tape 45 to the side 50 of the semiconductor chip 15. If the thermal interface material 115 is sufficiently tacky to readily adhere to the semiconductor chip 15, then the adhesive 120 may be swapped for an additional layer of the thermal interface material 115. The base layer 110 may be composed of a variety of materials suitable for tape backings or bases such as polyimide, fiberglass, polyurethane, polyesters, filled acrylic polymers, various papers or other like materials. The thermal interface material 115 is advantageously composed of various materials that are suitable for thermal interface functionality, such as, for example, silicone rubber, silicone greases, acrylic polymers or the like. The adhesive 120 may be composed of a variety of adhesives that have the ability to adhere both to the thermal interface material 115 and to the base 110 and should be relatively compliant to facilitate the types of bending movements required to ultimately lift the tape 45 from the semiconductor chip 15 at a later stage of processing. Examples include pressure sensitive acrylic adhesives, silicone pressure sensitive adhesives or the like. Another type of adhesive 120 that may be used is a light curable adhesive that may be spin coated on the semiconductor chip 15 at the wafer stage and thereafter coated with an optional backing and cured by exposure to UV or other radiation.

The thickness D of the thermal interface tape 45 may be selected to provide a desired thermal performance. While a variety of metrics may be used to specify a desired thermal performance, one useful rule of thumb is provided by:

$$\frac{(D)}{(k)(A)} < 0.2 \frac{K}{W} \qquad (1)$$

where D is the thickness of the thermal interface tape 45, k is the coefficient of thermal conductivity of the tape 45 and A is the surface area of the semiconductor chip 15 covered by the thermal interface tape 45. A typical unit for k is W/m-K. Since the thermal interface tape 45 is a composite of multiple layers of different materials, the coefficient k will be a composite coefficient of thermal conductivity for the combination of the various layers, such as the base 110, the thermal interface material 115 and the optional adhesive 120. Thus, with values of A and k in hand, a range of thicknesses D may be determined.

Figure 3:
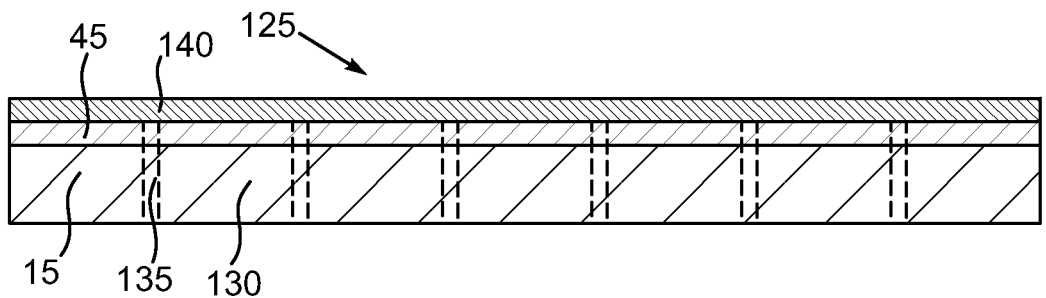
FIG. 3 is a sectional view of an exemplary embodiment of a semiconductor wafer following application of an exemplary thermal interface tape and wafer carrier tape.
Figure 4:
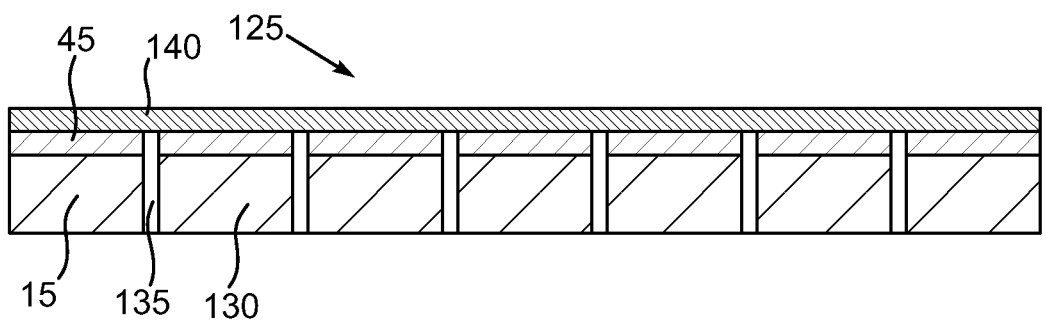
FIG. 4 is a sectional view like FIG. 3, but depicting the semiconductor wafer following dicing.
Figure 5:
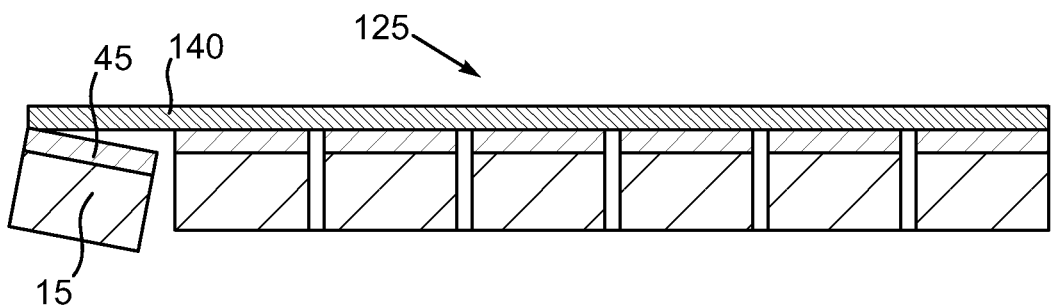
FIG. 5 is a sectional view like FIG. 4, but depicting the peeling of a singulated semiconductor chip from the wafer carrier tape.

An exemplary method for applying the thermal interface tape 45 to the semiconductor chip 15 may be understood by referring now to FIGS. 3, 4 and 5 and initially to FIG. 3. FIG. 3 is a sectional view of an exemplary semiconductor wafer 125 that includes multiple semiconductor chips, a few of which are visible, and one of which is the aforementioned semiconductor chip 15 and another of which is an adjacent semiconductor chip 130. A dicing street 135 shown in dashed extends vertically through the semiconductor wafer 125 between the semiconductor chip 15 and the semiconductor chip 130. Of course, the skilled artisan will appreciate that there will be multiple dicing streets that will be both parallel and orthogonal to the dicing street 135. The other dicing streets and semiconductor chips of the wafer 125 are shown but not separately labeled. The thermal interface tape 45 may be applied as a blanket to the semiconductor wafer 125 and then a wafer carrier tape 140 may be applied to the thermal interface tape 45. The function of the wafer carrier tape 140 is to provide a protective coating as well as a supporting structure to temporarily hold the semiconductor chips 15 and 130 during and temporarily after the dicing operation. The carrier tape 140 may be selected from various well-known dicing tapes. If desired, the thermal interface tape 45 and the carrier tape 140 may be applied together as a combination of tapes to the semiconductor wafer 125.

Next, and as shown in FIG. 4, the semiconductor wafer 125 is diced along the dicing streets 135. The dicing may be performed by a variety of means, such as mechanical sawing, laser drilling, aqua drilling, some combination of these or like. Note that the dicing operation cuts through the thermal interface tape 45 but not through the wafer carrier tape 140.

Attention is now turned to FIG. 5. Following the dicing operation, the semiconductor chip 15 may be peeled from the carrier tape 140 as shown. Here, the thermal interface tape 45 has sufficient bonding to the semiconductor chip 15 to stay connected thereto following the peeling operation. The peeling operation may be repeated for the other semiconductor chips such as the chip 130 as well. The singulated die or semiconductor chip 15 is now ready to be mounted to the carrier substrate 20 depicted in FIG. 1.

Figure 6:
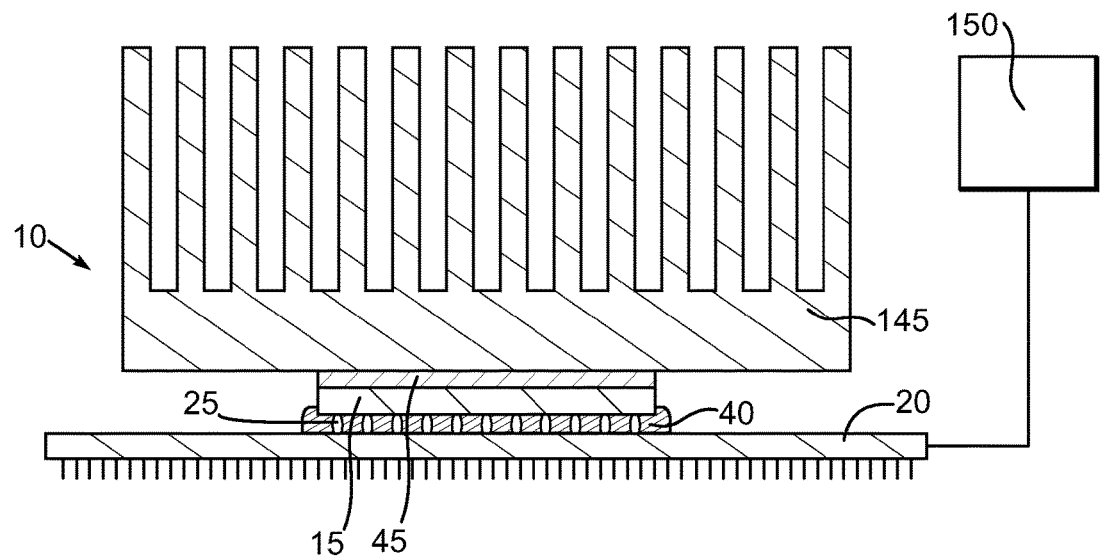
FIG. 6 is a sectional view of the exemplary semiconductor chip device fitted with a heat spreader and connected to a testing device.

FIG. 6 is a sectional view showing the singulated semiconductor chip 15 and the corresponding thermal interface tape 45 mounted to the carrier substrate 20. This process entails establishing the aforementioned interconnect structures 25. Depending upon the composition of the interconnect structures 25, this may entail, for example, a collapsible bump solder reflow process, a pillar to solder reflow process or even a thermal bonding between vertically aligned conductive pillars. In addition, the underfill material layer 30 may be dispensed between the semiconductor chip 15 and the carrier substrate 20 and subjected to a suitable curing process. With the thermal interface tape 45 in place, a suitable heat spreader 145 may be seated on the thermal interface tape and the carrier substrate 20 may be electrically connected to a testing device 150 which may be a computer, a server, some form of dedicated electronic testing device or the like. The semiconductor chip 15 may be subjected to a variety of different types of electrical tests at various power levels and frequencies to determine its suitability. The heat spreader 145 may be a passive device or an active device with active cooling capability.

Figure 7:
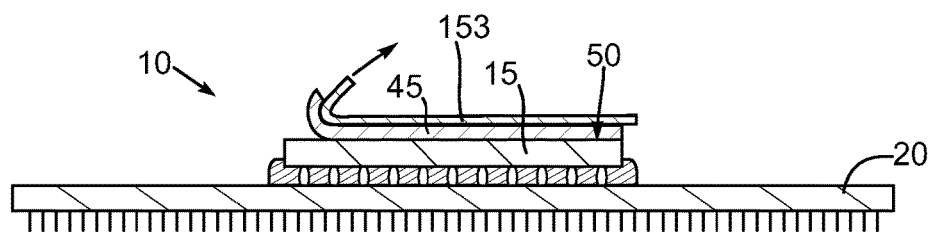
FIG. 7 is a sectional view of the exemplary semiconductor chip device undergoing removal of the thermal interface tape.

Referring now to FIG. 7, following the electrical test of the semiconductor chip and assuming that the semiconductor chip passed the various electrical tests, the thermal interface tape 45 may be peeled from the semiconductor chip 15 in anticipation of the mounting of an additional semiconductor chip to the semiconductor chip 15. The peeling process may be facilitated by the application and peeling of a de-taping tape 153. Adhesion control agents may be added to the thermal interface tape to keep peel forces below desired levels. Of course, the semiconductor chip 15 may thereafter undergo various cleaning processes to remove any unwanted residue leftover by the thermal interface tape 45 and so that the conductor structures, such as the I/O pads 100 and 105 depicted in FIG. 2 are exposed and thus ready to either electrically interface with another chip or to be subjected to various material deposition and patterning processes in the event that passivation or other types of layers are desired for the side 50 of the semiconductor chip 15.

Figure 8:
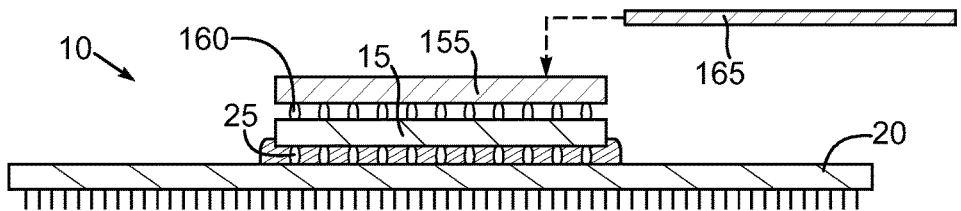
FIG. 8 is a sectional view of the exemplary semiconductor chip device undergoing stacking of another semiconductor chip and optional application of another thermal interface tape.

Referring now to FIG. 8, a second semiconductor chip 155 may be mounted to the semiconductor chip 15 and electrically interfaced therewith by way of plural interconnect structures 160. The interconnect structures 160 may be configured like the interface structures 25. The circuit board 20 may then be electrically connected to the test device 150 depicted in FIG. 6 and both the semiconductor chip 15 and the semiconductor chip 155 may be subjected to additional electrical testing. Indeed, the process could be repeated in that the semiconductor chip 55 could be fitted with a thermal interface tape 165 that is configured as described elsewhere herein with regard to the thermal interface tape 45 and the entire process essentially repeated. The semiconductor chips 15 and 155 may be any of a myriad of different types of circuit devices used in electronics, such as, for example, microprocessors, graphics processors, combined microprocessor/graphics processors, application specific integrated circuits, memory devices, active optical devices, such as lasers, or the like, and may be single or multi-core or even stacked laterally with additional dice. Furthermore, one or both of the semiconductor chips 15 and 155 could be configured as an interposer with or without some logic circuits. Thus the term "chip" includes an interposer. The semiconductor chips 15 and 155 may be constructed of bulk semiconductor, such as silicon or germanium, or semiconductor on insulator materials, such as silicon-on-insulator materials.

Figure 9:
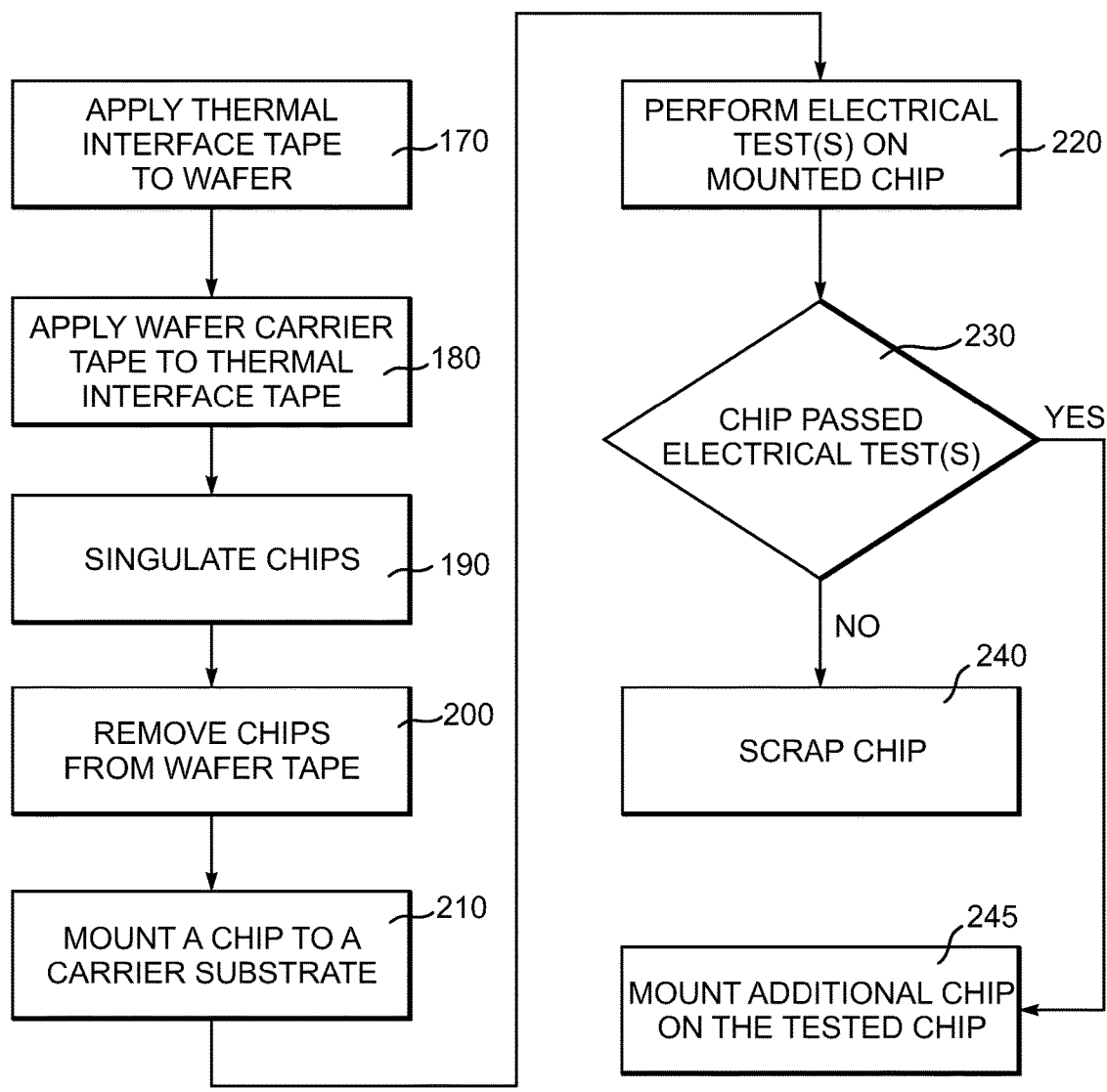
FIG. 9 is a flow chart of an exemplary assembly and testing process for the exemplary semiconductor chip device.

An exemplary process flow may be understood by referring now to FIG. 9 which is a flow chart. At step 170, a thermal interface tape such as the thermal interface tape 45 depicted in other figures, may be applied to a semiconductor wafer. Next, at step 180 a wafer carrier tape may be applied to the thermal interface tape. As noted above however, the application of the thermal interface tape and the carrier tape may be combined into a single step by first joining the thermal interface tape and the carrier tape and then securing the thermal interface tape to the wafer. Next, at step 190, the individual semiconductor chips or dice are singulated from the semiconductor wafer. Following the singulation, the singulated semiconductor chips or dice may be removed from the wafer carrier tape at step 200. Next, and at step 210, a die is mounted to a carrier substrate. Next, and at step 220, various electrical tests may be performed on the mounted die. If at step 230, the tested die does not pass the electrical tests, then the die may be scrapped at step 240. If however the die passes the electrical tests, then additional die may be mounted to the tested die and the entire process repeated. Note however that thermal interface tape could be applied to any of the semiconductor chips such as the semiconductor chips 15 and 155 and others on a die as opposed to a wafer level basis.

The usage of a temporary thermal interface tape may find benefits in context other than a vertical stacked semiconductor chip arrangement or in cases where a stacked chip arrangement does not utilize a lower most semiconductor chip with a backside metallization structure. In this regard, attention is now turned to FIG. 10, which is a sectional view like FIG. 2 but of an alternate exemplary embodiment of a semiconductor chip 15' that utilizes the aforementioned thermal interface tape 45 but which does not include a backside metallization structure such as the RDL structure 65 depicted in FIG. 2. Here, there is no backside metallization structure but an optional metallic thermal interface foil 250 may be positioned on the side 255 of the semiconductor chip 15' to provide an advantageous thermal pathway to the thermal interface portion 115 of the thermal interface tape 45. The foil 250 may be composed of indium, gallium, alloys of these or other well-known materials suitable for thermal interface material foils. The tape 45 may consist of a base layer 110, a thermal interface material layer 115 as well as an adhesive layer 120 as described generally elsewhere herein.

As shown in FIG. 11, which is a partially exploded pictorial view, any of the disclosed embodiments of the thermal interface tape, in this example tape 45, may be applied to the semiconductor chip 15 on an individual basis as opposed to en masse to unsingulated chips. Here, the thermal interface tape 45 is shown exploded from the semiconductor chip 15 which is already mounted on the circuit board 20.

The skilled artisan will also appreciate that a given semiconductor wafer may be processed so that not all of the semiconductor chips contain therein are covered with a thermal interface tape prior to a dicing operation. Attention is now turned to FIG. 12, which is a pictorial view of a semiconductor wafer 260 that includes a plurality of semiconductor chips 265 some of which are coated with a thermal interface tape 270 and a wafer carrier tape 275 that both may be configured as generally described elsewhere herein. The remainder of the semiconductor chips 265 are not coated with the thermal interface tape 270 but may be optionally coated with another portion of wafer carrier tape 280 as desired. This particular arrangement may be suitable in circumstances where not all the semiconductor chips 265 of the semiconductor wafer 260 are slated for stacked semiconductor chip arrangements or in other circumstances where the application of the thermal interface tape 270 is not desired.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents and alternatives falling within the spirit and scope of the invention as defined by the following appended claims.

What is claimed is:

1. A method of manufacturing, comprising:
applying a thermal interface tape to a side of a semiconductor wafer including at least one semiconductor chip, the at least one semiconductor chip having plural front side interconnects and plural backside interconnects, the thermal interface tape being positioned on the at least one semiconductor chip over the backside interconnects; and
singulating the at least one semiconductor chip from the semiconductor wafer with at least a portion of the thermal interface tape still attached to the semiconductor chip.

2. The method of claim 1, comprising applying a wafer carrier tape to the thermal interface tape.

3. The method of claim 2, comprising applying the wafer carrier tape to the thermal interface tape after the thermal interface tape is applied to the at least one semiconductor chip.

4. The method of claim 2, comprising applying the wafer carrier tape to the thermal interface tape before the thermal interface tape is applied to the at least one semiconductor chip.

5. The method of claim 1, wherein the thermal interface tape comprises a base and a thermal interface material coupled to the base, the thermal interface material contacting the side of the semiconductor wafer.

6. The method of claim 1, comprising placing a heat spreader in thermal contact with the thermal interface tape and performing an electrical test on the at least one semiconductor chip.

7. The method of claim 6, comprising removing the thermal interface tape after the electrical test and stacking another semiconductor chip on the at least one semiconductor chip.

8. A method of testing a semiconductor chip device, comprising:

applying a first thermal interface tape to a side of a first semiconductor chip of the semiconductor chip device, the first semiconductor chip having plural front side interconnects and plural backside interconnects, the first thermal interface tape being positioned over the backside interconnects;

placing a heat spreader in thermal contact with the first thermal interface tape; and performing an electrical test on the first semiconductor chip.

9. The method of claim 8, wherein the first thermal interface tape comprises a base and a thermal interface material coupled to the base, the thermal interface material contacting the side of the first semiconductor chip.

10. The method of claim 8, comprising removing the first thermal interface tape after the electrical test and stacking a second semiconductor chip on the first semiconductor chip.

11. The method of claim 10, comprising applying a second thermal interface tape to a side of the second semiconductor chip.

12. The method of claim 11, comprising performing an electrical test on the first or the second semiconductor chips.

13. A method of manufacturing, comprising:

applying a thermal interface tape to a side of a semiconductor wafer including at least one semiconductor chip, the at least one semiconductor chip having plural front side interconnects and plural backside interconnects, the thermal interface material tape being positioned on the at least one semiconductor chip over the backside interconnects;

singulating the at least one semiconductor chip from the semiconductor wafer with at least a portion of the thermal interface tape still attached to the semiconductor chip; and mounting the at least one semiconductor chip to a carrier substrate.

14. The method of claim 13, comprising performing an electrical test on the at least one semiconductor chip.

15. The method of claim 14, mounting an additional semiconductor chip on the at least one semiconductor chip.

16. The method of claim 15, comprising placing a heat spreader in thermal contact with the thermal interface tape prior to the electrical test.

* * * * *